(12) United States Patent
Root et al.

(10) Patent No.: US 8,149,009 B2
(45) Date of Patent: Apr. 3, 2012

(54) APPARATUS AND METHOD FOR TERMINATING PROBE APPARATUS OF SEMICONDUCTOR WAFER

(75) Inventors: Bryan J. Root, Apple Valley, MN (US); William A. Funk, Eagan, MN (US)

(73) Assignee: Celadon Systems, Inc., Apple Valley, MN (US)

( * ) Notice: Subject to any disclaimer, the term of this patent is extended or adjusted under 35 U.S.C. 154(b) by 0 days.

(21) Appl. No.: 12/820,640

(22) Filed: Jun. 22, 2010

(65) Prior Publication Data

US 2010/0259288 A1    Oct. 14, 2010

Related U.S. Application Data

(60) Continuation of application No. 12/372,049, filed on Feb. 17, 2009, now Pat. No. 7,768,282, which is a continuation of application No. 11/610,016, filed on Dec. 13, 2006, now abandoned, which is a division of application No. 11/266,144, filed on Nov. 3, 2005, now Pat. No. 7,170,305.

(60) Provisional application No. 60/656,076, filed on Feb. 24, 2005.

(51) Int. Cl.
*G01R 31/00* (2006.01)

(52) U.S. Cl. ............... 324/755.02; 324/760.01

(58) Field of Classification Search .......... None
See application file for complete search history.

(56) References Cited

U.S. PATENT DOCUMENTS

| | | |
|---|---|---|
| 3,866,119 A | 2/1975 | Ardezzone et al. |
| 3,963,986 A | 6/1976 | Morton et al. |
| 4,480,223 A | 10/1984 | Aigo |
| 4,731,577 A | 3/1988 | Logan |
| 4,845,426 A | 7/1989 | Nolan et al. |
| 5,397,996 A | 3/1995 | Keezer |
| 5,449,017 A | 9/1995 | Collins et al. |
| 5,525,911 A | 6/1996 | Marumo et al. |
| 5,663,653 A | 9/1997 | Schwindt et al. |
| 5,729,150 A | 3/1998 | Schwindt |

(Continued)

FOREIGN PATENT DOCUMENTS

EP     0 107 327     5/1984

(Continued)

OTHER PUBLICATIONS

International Search Report of PCT/US2006/004249, dated Jun. 20, 2006 (3 pages).

*Primary Examiner* — Minh N Tang
(74) *Attorney, Agent, or Firm* — Hamre, Schuman, Mueller & Larson, P.C.

(57) ABSTRACT

A probe apparatus and method of terminating a probe that probes a semiconductor device with a signal cable from a tester side by side at a proximal end of the probe and a distal end of the signal cable. In one embodiment, the probe apparatus includes: a chassis; a dielectric block mounted in the chassis for retaining the probe, the probe extending on the chassis from a proximal end of the probe to the dielectric block, extending through the dielectric block, and projecting from the dielectric block towards the semiconductor device at a distal end of the probe; and a terminating apparatus, mounted in the chassis, for terminating the proximal end of the probe with a distal end of the signal cable side by side.

7 Claims, 5 Drawing Sheets

U.S. PATENT DOCUMENTS

| | | | |
|---|---|---|---|
| 6,075,376 | A | 6/2000 | Schwindt |
| 6,124,723 | A | 9/2000 | Costello |
| 6,137,302 | A | 10/2000 | Schwindt |
| 6,201,402 | B1 | 3/2001 | Root |
| 6,276,956 | B1 | 8/2001 | Cook |
| 6,586,954 | B2 | 7/2003 | Root |
| 6,603,322 | B1 | 8/2003 | Boll et al. |
| 6,847,219 | B1 | 1/2005 | Lesher et al. |
| 6,963,207 | B2 | 11/2005 | Root et al. |
| 7,170,305 | B2 | 1/2007 | Root et al. |
| 7,768,282 | B2 * | 8/2010 | Root et al. ............... 324/754.12 |
| 2001/0011902 | A1 | 8/2001 | Schwindt |
| 2001/0031589 | A1 | 10/2001 | Bunyan et al. |
| 2004/0000920 | A1 | 1/2004 | Root et al. |
| 2004/0051541 | A1 | 3/2004 | Zhou et al. |
| 2005/0253612 | A1 | 11/2005 | Root et al. |
| 2006/0186903 | A1 | 8/2006 | Root et al. |

FOREIGN PATENT DOCUMENTS

| | | |
|---|---|---|
| EP | 0 177 809 | 4/1986 |
| WO | 99/04273 | 1/1999 |
| WO | 2004/081980 | 9/2004 |

* cited by examiner

APPARATUS AND METHOD FOR TERMINATING PROBE APPARATUS OF SEMICONDUCTOR WAFER

CROSS-REFERENCE TO RELATED APPLICATIONS)

This patent application is a continuation of U.S. Utility patent application Ser. No. 12/372,049 filed on Feb. 17, 2009 and issued as U.S. Pat. No. 7,768,282, which is a continuation of U.S. Utility patent application Ser. No. 11/610,016 filed on Dec. 13, 2006 and now abandoned, which is a divisional of U.S. Utility patent application Ser. No. 11/266,144 filed on Nov. 3, 2005 and issued as U.S. Pat. No. 7,170,305, and which claims the benefit of the priority of U.S. Provisional Patent Application Ser. No. 60/656,076, filed on Feb. 24, 2005, which is related to U.S. Utility patent application Ser. No. 10/383,079, filed on Mar. 6, 2003 and issued as U.S. Pat. No. 6,963,207; and the subject matters of which are incorporated herewith by reference.

FIELD OF THE INVENTION

The present invention generally relates to semiconductor test equipment, and more particularly, to a probe apparatus used in semiconductor test equipment for electrically probing devices on a semiconductor wafer.

BACKGROUND OF THE INVENTION

The semiconductor industry has a need to access many electronic devices on a semiconductor wafer. As the semiconductor industry grows and devices become more complex, many electrical devices, most commonly semiconductor devices, must be electrically tested, for example, for leakage currents and extremely low operating currents. These currents are often below 100 fA. In addition, the currents and device characteristics are often required to be evaluated over a wide temperature range to understand how temperature affects a device. Also, because of materials characteristics of dielectrics, it is often difficult to test characteristics of semiconductor devices in a wide operating temperature range.

To effectively measure at currents below 100 fA (Femto Ampere), a measurement signal must be isolated from external electrical interference, leakage currents through the dielectric material, parasitic capacitance, triboelectric noise, piezoelectric noise, and dielectric absorption, etc.

Accordingly, there is a need for improved semiconductor test equipment for electrically probing semiconductor devices at low currents over a wide temperature range.

SUMMARY OF THE INVENTION

To solve the above and the other problems, the present invention provides a probe apparatus having a probe that probes a semiconductor device and terminates with a signal cable side by side. More particularly, the present invention provides a probe apparatus having a probe that probes a semiconductor device and terminates with a signal cable side by side at a proximal end of the probe and a distal end of the signal cable.

In one embodiment of the present invention, the probe apparatus includes: a chassis; a dielectric block mounted in the chassis for retaining the probe, the probe extending on the chassis from a proximal end of the probe to the dielectric block, extending through the dielectric block, and projecting from the dielectric block towards the semiconductor device at a distal end of the probe; and a terminating apparatus, mounted in the chassis, for terminating the proximal end of the probe with a distal end of the signal cable side by side.

Still in one embodiment, the probe extends along a dielectric plate towards a semiconductor device at a distal end of the probe. The signal cable extends along the dielectric plate towards a test equipment at a proximal end.

Further, the present invention provides a method of terminating a probe that probes a semiconductor device with a signal cable from a tester. The method includes the steps of stripping back at least one layer of the signal cable and at least one layer of the probe; crimping a proximal end of the probe with a distal end of the signal cable side by side; and mounting the probe and the signal cable in a chassis, wherein a distal end of the probe is extended towards the semiconductor device, and a proximal end of the signal cable is extended towards the tester.

These and other advantages of the present invention will become apparent to those skilled in the art from the following detailed description, wherein it is shown and described illustrative embodiments of the invention, including best modes contemplated for carrying out the invention. As it will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION OF THE PREFERRED EMBODIMENTS

Figure 1:
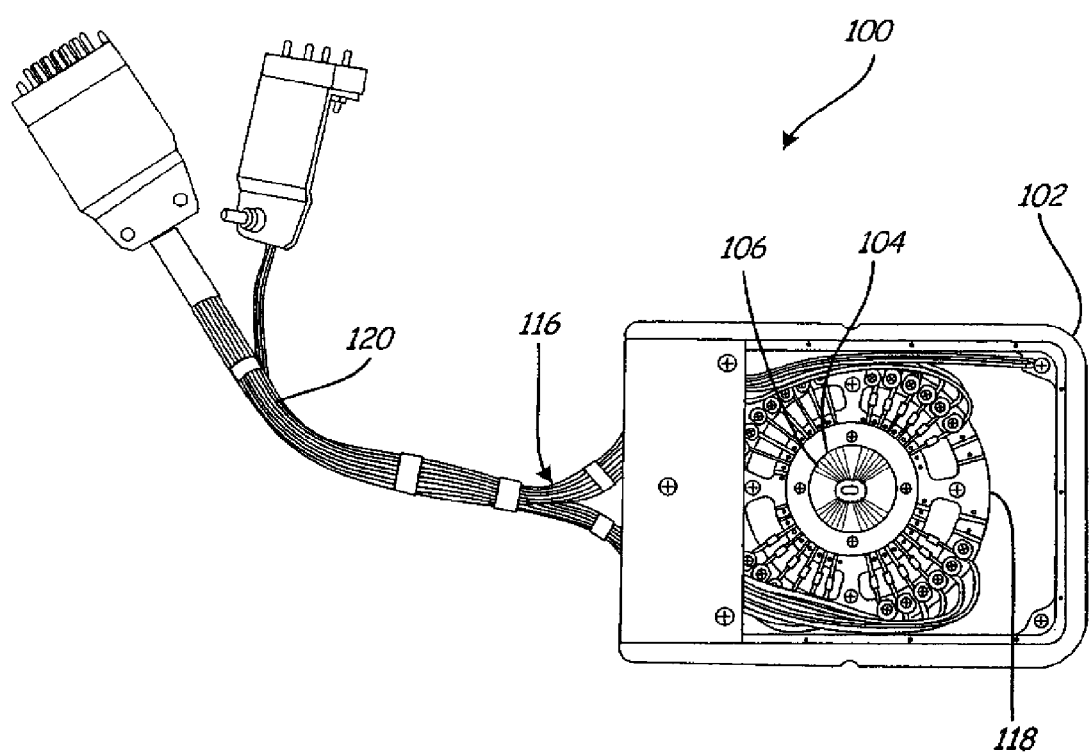
FIG. 1 illustrates a perspective view of one embodiment of a probing apparatus in accordance with the principles of the present invention.
Figure 2:
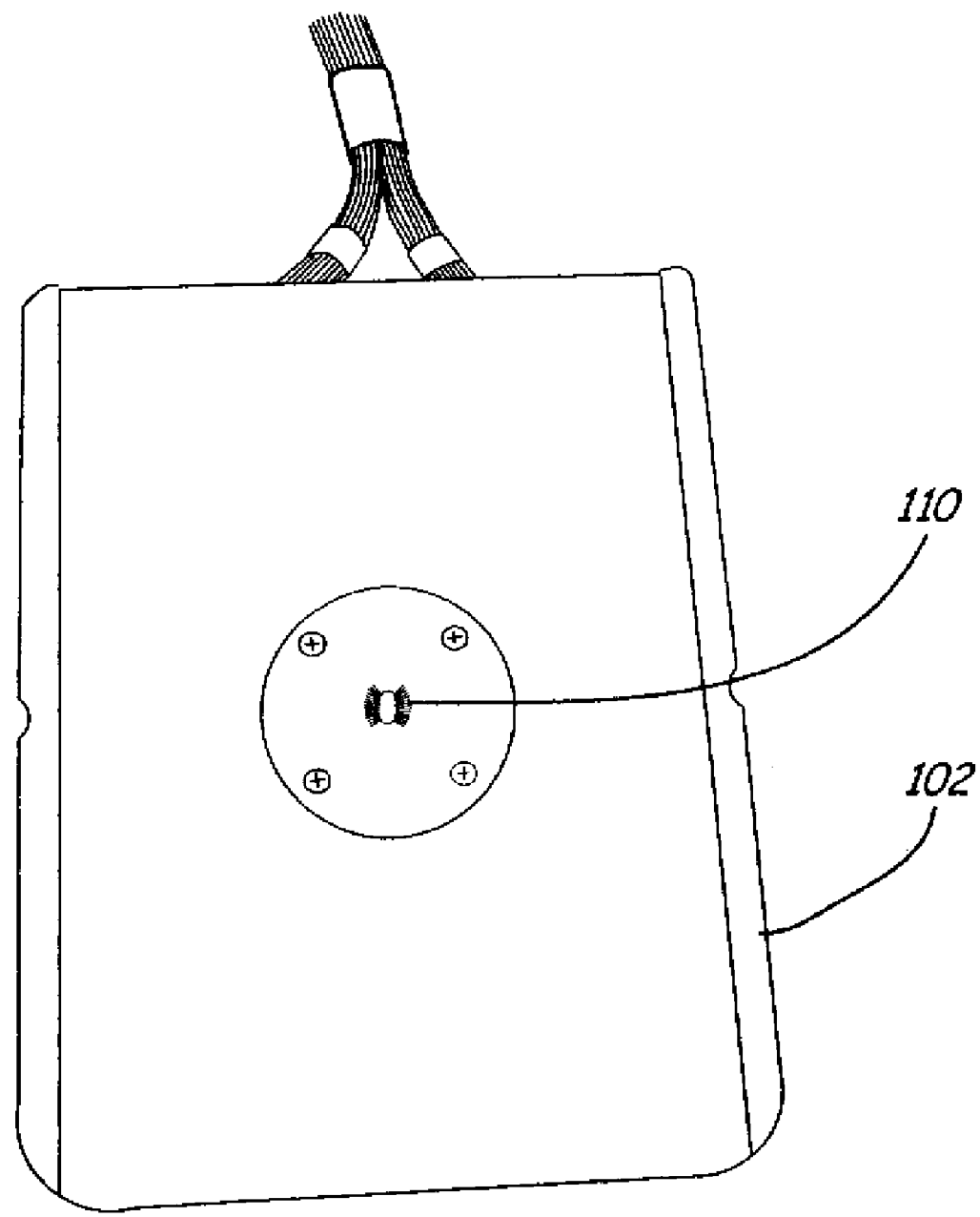
FIG. 2 illustrates a bottom view of one embodiment of the probing apparatus in accordance with the principles of the present invention.
Figure 3:
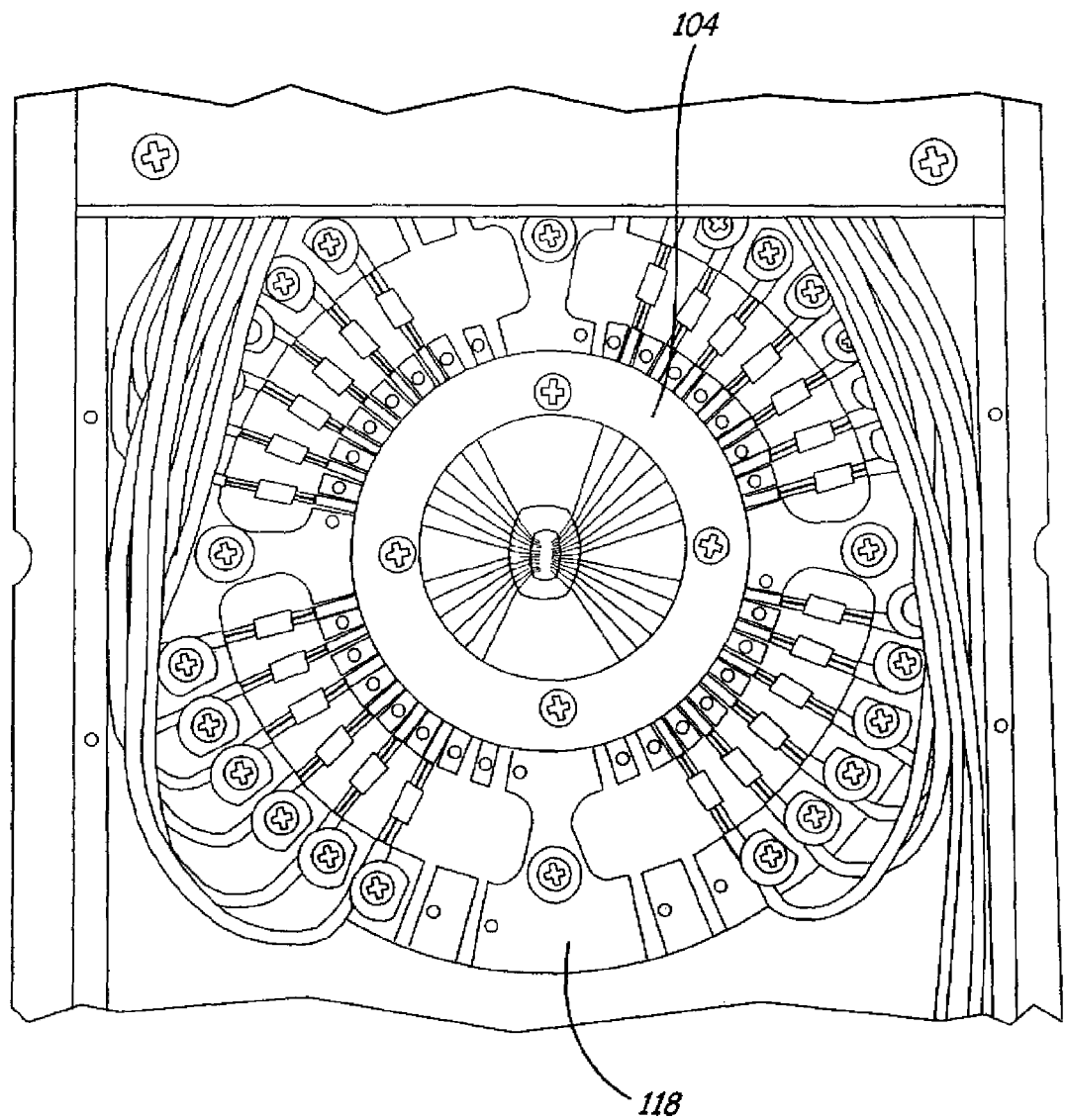
FIG. 3 illustrates a partial top view of one embodiment of the probing apparatus in accordance with the principles of the present invention.
Figure 4:
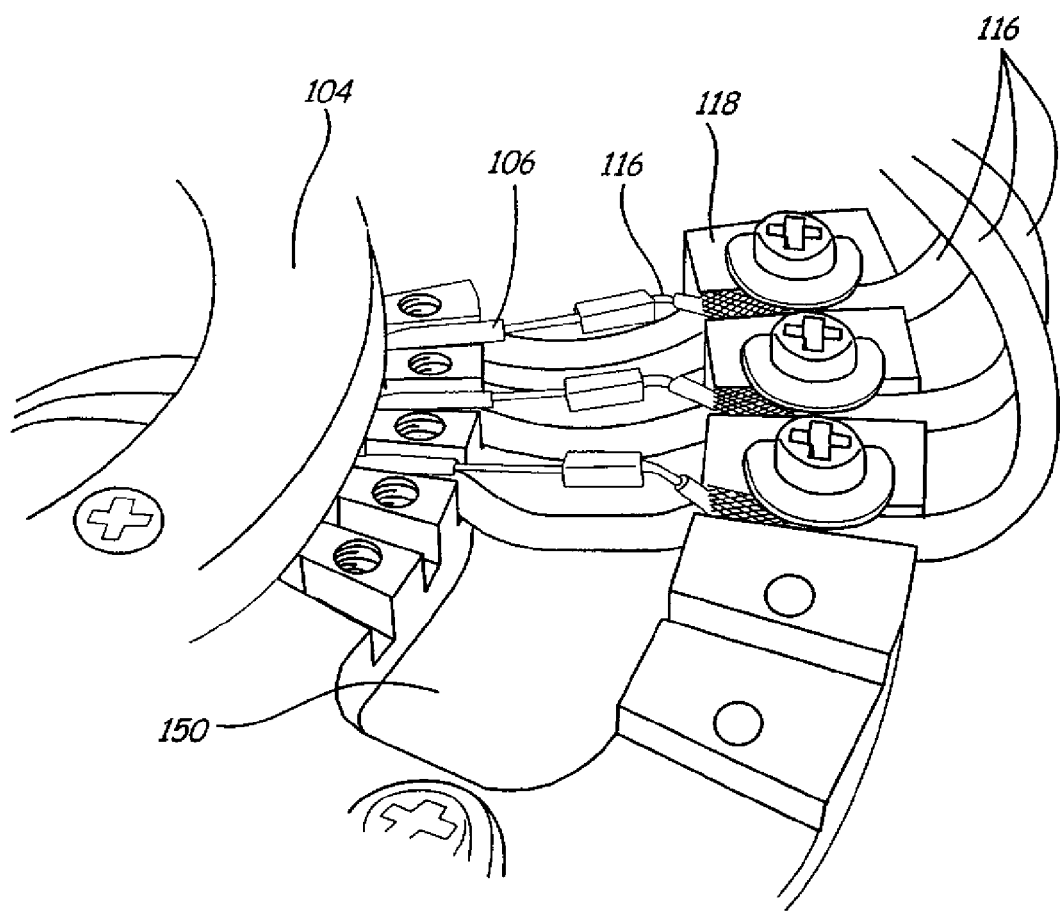
FIG. 4 illustrates an enlarged partial, perspective view of one embodiment of the probing apparatus in accordance with the principles of the present invention.

In FIGS. 1-5, a probe apparatus 100 in accordance with the principles of the present invention includes a chassis 102, a dielectric block 104 mounted in the chassis 102 for retaining a probe 106. The probe 106 extends on the chassis 102 from a proximal end 108 of the probe 106 to the dielectric block 104, extending through the dielectric block 104, and projecting from the dielectric block 104 towards a device, e.g. semiconductor device (not shown), at a distal end 110 of the probe 106.

The apparatus 100 also includes a terminating apparatus 112, mounted in the chassis 102, for terminating the proximal end 108 of the probe 106 with a distal end 114 of a signal cable 116 side by side.

Also, the probe 106 extends along a dielectric plate 118 towards the semiconductor device (not shown) at the distal end 110 of the probe 106. The signal cable 116 extends along the dielectric plate 118 towards a test equipment (not shown) at a proximal end 120.

Figure 5:
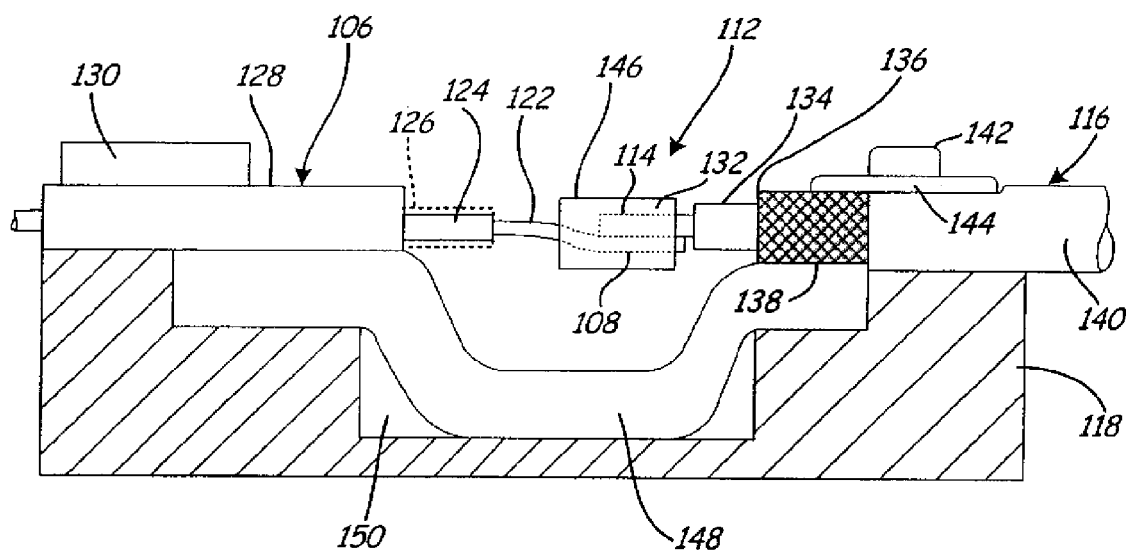
FIG. 5 illustrates a cross-sectional view of one embodiment of the probing apparatus in accordance with the principles of the present invention.

Also shown in FIG. 5, the probe 106 includes a probe conductor 122 surrounded by a dielectric layer 124. The dielectric layer 124 is coated by a conductive coating layer 126 which is covered by a conductive high temperature foam 128. A strain relief clamp 130 clamps the probe 106 onto the dielectric plate 118.

In FIG. 5, the signal cable 116 includes a center conductor 132 surrounded by a dielectric layer 134. The center conductor 132 may be a coaxial or tri-axial signal wire. The dielectric layer 134 is covered by a conductive triboelectric low noise coating 136. The coating 136 is covered by a conductive guard 138. An insulator jacket 140 is used to cover the conductive guard 138. In addition, a strain relief screw 142 and a strain relief washer 144 clamp the signal cable 116 onto the dielectric plate 118.

The terminating apparatus 112 further includes a crimp 146. The crimp 146 terminates the proximal end 108 of the probe 106 with the distal end 114 of the signal cable 116 side by side.

In FIG. 5, a conductive high temperature foam 148 is disposed between the probe 106 and the dielectric plate 118 on one side, and between the signal cable 116 and the dielectric plate 118 on the other side. The remaining part of the foam 148 is disposed within an opening area 150 of the dielectric plate 118.

The numerous innovative teachings of the present application will be described with particular reference to the presently preferred embodiments, wherein these innovative teachings are advantageously applied to the particular problems of a probe apparatus for measuring low currents with a wide operating temperature range in probing a semiconductor device. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

The following terms are particularly described throughout the description:

Semiconductor Device Not Limitive

The present invention is particularly suitable for probing semiconductor devices, but the use of the present teachings is not limited to probing semiconductor devices. Other devices, such as biological devices, may be applied to the present invention teachings. Thus, while this specification speaks in terms of probing 'semiconductor' devices, this term should be interpreted broadly to include probing any suitable device.

Low Current Not Limitive

The present invention solves the problem of measuring currents below 100 fA, but the current range of the present teachings is not limited to below 100 fA. For example, the present invention may be applied to measure the currents at or above 100 fA in a semiconductor device. Thus, while this specification speaks in terms of 'low currents' or 'measuring currents below 100 fA', these terms should be interpreted broadly to include any current that flows through a semiconductor device which could be at or above 100 fA.

Wide Temperature Not Limitive

The present invention solves the problem of measuring currents of a semiconductor device in a narrow or limited operating temperature range. The present teachings do not limit to a specific operating temperature range. The present application allows a tester to electrically probe semiconductor devices over a wide operating temperature range, not only at a low operating temperature but also a high operating temperature, e.g. an operating temperature up to 300 C and beyond. Thus, while this specification speaks in terms of 'wide temperature range' or 'measuring currents in a wide operating temperature range', these terms should be interpreted broadly to include any suitable operating or testing temperature range of a semiconductor device.

Size Not Limitive

The present invention solves the problem of measuring currents and voltages of a semiconductor device using a compact probing apparatus. However, nothing in the teachings of the present invention limits application of the teachings of the present invention to a larger or smaller probe apparatus. Advantageous use of the teachings of the present invention may be had with a probe apparatus of any size.

Materials Not Limitive

Throughout the discussion herein there will be examples provided that make reference to materials, such as ceramic, in regards to dielectric block. The present invention does not recognize any limitations in regards to what types of materials may be used in affecting the teachings of the present invention. One skilled in the art will recognize that any suitable material may be used with no loss of generality in implementing the teachings of the present invention.

From the above description and drawings, it will be understood by those of ordinary skill in the art that the particular embodiments shown and described are for purposes of illustration only and are not intended to limit the scope of the present invention. Those of ordinary skill in the art will recognize that the present invention may be embodied in other specific forms without departing from its spirit or essential characteristics. References to details of particular embodiments are not intended to limit the scope of the invention.

What is claimed is:

1. A method of terminating a probe that probes a semiconductor device with a signal cable from a tester, comprising the steps of:
    stripping back at least one layer of the signal cable and at least one layer of the probe;
    crimping a proximal end of the probe with a distal end of the signal cable side by side; and
    mounting the probe and the signal cable in a chassis, including disposing a conductive high temperature layer between the probe and the chassis on a first side of the conductive high temperature layer, and between the signal cable and the chassis on a second side of the conductive high temperature layer, wherein a distal end of the probe is extended towards the semiconductor device, and a proximal end of the signal cable is extended towards the tester.

2. A probe apparatus for probing a semiconductor device by a tester, comprising:
    a probe that probes the semiconductor device mounted on a probe station; wherein the probe extends from a distal end to a proximal end of the probe, the distal end and the proximal end are conductively connected, and the probe comprises:
        a probe conductor;
        a dielectric layer, the dielectric layer being disposed around the probe conductor;
        a conductive coating layer, the conductive coating layer covering and being disposed around the probe dielectric layer;
        a conductive high temperature layer, the conductive high temperature layer being disposed around the conductive coating layer; and a strain relief device mounting the probe onto the probe station;

a signal cable that carries a signal from the probe to the tester;

a terminating device that terminates the proximal end of the probe with a distal end of the signal cable side by side; and a second conductive high temperature layer which is disposed between the probe and the probe station on a first side of the second conductive high temperature layer, disposed between the signal cable and the probe station on a second side of the second conductive high temperature layer, and disposed within an opening area of the probe station therebetween.

3. The probe apparatus of claim 2, wherein the signal cable comprises: a center conductor; a dielectric layer, the dielectric layer being disposed around the center conductor; a conductive coating, the conductive coating covering and being disposed around the dielectric layer; a conductive guard, the conductive guard being disposed around the conductive coating; an insulator jacket, the insulator jacket covering the conductive guard; and a second strain relief device mounting the signal cable onto the probe station.

4. The probe apparatus of claim 3, wherein the center conductor is a coaxial signal wire.

5. The probe apparatus of claim 3, wherein the center conductor is a tri-axial signal wire.

6. The probe apparatus of claim 2, wherein the terminating device further comprises a crimp which terminates the proximal end of the probe with the distal end of the signal cable side by side.

7. The probe apparatus of claim 2, wherein the proximal end of the probe includes at least a portion of the probe conductor.

* * * * *